(12) United States Patent
McMahan et al.

(10) Patent No.: US 10,475,715 B2
(45) Date of Patent: Nov. 12, 2019

(54) TWO MATERIAL HIGH K THERMAL ENCAPSULANT SYSTEM

(71) Applicant: Intel Corporation, Santa Clara, CA (US)

(72) Inventors: Venmathy McMahan, Phoenix, AZ (US); Sivakumar Nagarajan, Chandler, AZ (US); Elah Bozorg-Grayeli, Chandler, AZ (US); Amrita Mallik, Chandler, AZ (US); Kuang-Han Chu, Somerville, MA (US); Liwei Wang, Phoenix, AZ (US); Nisha Ananthakrishnan, Chandler, AZ (US); Craig J. Weinman, Mesa, AZ (US); Amram Eitan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 218 days.

(21) Appl. No.: 15/037,851

(22) PCT Filed: Jun. 17, 2015

(86) PCT No.: PCT/US2015/036272
§ 371 (c)(1),
(2) Date: May 19, 2016

(87) PCT Pub. No.: WO2016/204753
PCT Pub. Date: Dec. 22, 2016

(65) Prior Publication Data
US 2017/0170088 A1    Jun. 15, 2017

(51) Int. Cl.
*H01L 23/29* (2006.01)
*H01L 23/31* (2006.01)
(Continued)

(52) U.S. Cl.
CPC ............ *H01L 23/29* (2013.01); *H01L 21/563* (2013.01); *H01L 23/18* (2013.01); *H01L 23/31* (2013.01);
(Continued)

(58) Field of Classification Search
None
See application file for complete search history.

(56) References Cited

U.S. PATENT DOCUMENTS 5,629,566 A * 5/1997 Doi ...................... H01L 21/563
257/711
2003/0089999 A1   5/2003 Akram
(Continued)

FOREIGN PATENT DOCUMENTS

JP          0855938 A    2/1996
JP       2002110897 A    4/2002
(Continued)

OTHER PUBLICATIONS

"International Application Serial No. PCT/US2015/036272, International Preliminary Report on Patentability dated Dec. 28, 2017", 6 pgs.
(Continued)

*Primary Examiner* — Alexander G Ghyka
(74) *Attorney, Agent, or Firm* — Schwegman Lundberg & Woessner, P.A.

(57) ABSTRACT

Some embodiments relate to an electronic package. The electronic package includes a first die and a second die stacked onto the first die. A first encapsulant is positioned between the first die and the second die. The first encapsulant includes a first material that covers a first volume between the first die and the second die. A second encapsulant is positioned between the first die and the second die. The second encapsulant includes a second material that
(Continued)

covers a second volume between the first die and the second die. The first material has a higher thermal conductivity than the second material, and the second material more effectively promotes electrical connections between the first die and the second die as compared to the first material.

11 Claims, 6 Drawing Sheets

(51) Int. Cl.
   *H01L 23/48*       (2006.01)
   *H01L 21/56*       (2006.01)
   *H01L 23/18*       (2006.01)
   *H01L 23/373*      (2006.01)
   *H01L 25/065*      (2006.01)
   *H01L 25/07*       (2006.01)
   *H01L 23/00*       (2006.01)

(52) U.S. Cl.
   CPC .......... *H01L 23/3737* (2013.01); *H01L 23/48* (2013.01); *H01L 24/00* (2013.01); *H01L 25/0657* (2013.01); *H01L 25/074* (2013.01); *H01L 2225/06572* (2013.01); *H01L 2225/06589* (2013.01)

(56) References Cited

U.S. PATENT DOCUMENTS

| | | | |
|---|---|---|---|
| 2004/0009631 A1* | 1/2004 | Connell | H01L 21/561 |
| | | | 438/127 |
| 2006/0006518 A1* | 1/2006 | Bolken | H01L 21/565 |
| | | | 257/686 |
| 2008/0061447 A1 | 3/2008 | Matayabas, Jr. et al. | |
| 2013/0320249 A1 | 12/2013 | Kim et al. | |
| 2014/0091460 A1 | 4/2014 | Lee | |
| 2014/0322865 A1 | 10/2014 | Kim et al. | |
| 2015/0001736 A1 | 1/2015 | Shi et al. | |

FOREIGN PATENT DOCUMENTS

| | | |
|---|---|---|
| JP | 2015070187 A | 4/2015 |
| JP | 2018518824 A | 7/2018 |
| TW | 201701425 | 1/2017 |
| WO | 2016204753 | 12/2016 |

OTHER PUBLICATIONS

"International Application Serial No. PCT/US2015/036272, International Search Report dated Feb. 29, 2016", 3 pgs.

"International Application Serial No. PCT/US2015/036272, Written Opinion dated Feb. 29, 2016", 4 pgs.

"European Application Serial No. 15895800.9, Extended European Search Report dated Nov. 29, 2016", 7 pgs.

"Japanese Application Serial No. 2017-553015, Office Action dated Dec. 11, 2018", w/ English translation, 5 pgs.

"Japanese Application Serial No. 2017-553015, Final Notification of Reasons for Rejection dated Jun. 11, 2019", w English Translation, 11 pgs.

"European Application Serial No. 15895800.9, Response filed Jun. 28, 2019 to Extended European Search Report dated Nov. 29, 2018", 23 pgs.

"Japanese Application Serial No. 2017-553015, Voluntary Amendment filed Jul. 18, 2019", w English claims, 6 pgs.

* cited by examiner

TWO MATERIAL HIGH K THERMAL ENCAPSULANT SYSTEM

TECHNICAL FIELD

Embodiments described herein generally relate to an electronic package and a method of connecting a first die to a second die using a two material high thermal conductivity encapsulant system to form an electronic package.

BACKGROUND

Minimizing transistor size in order to keep up with Moore's law continually requires reducing first level interconnect (FLI) pitch and bump size. In addition, using advanced dielectrics has often resulted in utilizing low-k and extremely low thermal conductivity materials in silicon.

The combination of these factors results in higher sensitivity to stress during assembly and thermo-mechanical stress. Therefore, with each new technological advancement, solutions for reducing thermo-mechanical stress become significantly more important.

Stacking chips (CPU, memory, graphics etc.) one on top of one another results in shorter interconnect lines for improved electrical performance (e.g., higher bandwidth and/or lower latency for use in different product segments). However, chip stacking results in increased thermal resistance making it more difficult to remove heat from the CPU relative to non-stacked chips.

Analysis of conventional stacked electronic devices indicates that the thermal resistance of encapsulant layers is the key limiter in transferring heat from stacked packages. Current package architectures use inter-chip encapsulant materials that typically include silica fillers.

The composite thermal conductivity of these typical encapsulants range usually limits the ability of the electronic devices that include the encapsulant formulations to transfer heat from stacked electronic devices.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic packages and methods described herein may partially utilize fillers that include large particles sizes and high volume fractions to formulate composites with higher bulk thermal. While it may be technically feasible to engineer a material specifically for high thermal conductivity, the higher thermal conductivity would come with a tradeoff negative in using a material would make for a much more difficult die attachment process. As an example, maximizing filler volume fraction and maximizing the mean particle size are conducive to higher thermal conductivity but this increases filler entrapment risk and may interfere with joint formation altogether.

The electronic packages and methods described herein may use two encapsulant materials to (i) bond a logic die to memory die (and/or memory to memory die and/or logic die to logic die); and (ii) dissipate heat from bottom logic die to the top memory to enable higher thermal dissipation in higher powered stacked packages. The use of two-encapsulant materials to improve thermal dissipation in stacked chips may be suitable for use with a variety of electronic different package architectures.

The basic principle of the electronic packages and methods described herein is to use two materials (instead of one) to make inter-chip joints and enable greater thermal dissipation in a variety of electronic package architectures. As an example, material 1 may form the joints and encapsulate the joints and material 2 may dissipate heat from the bottom die to the top die.

The two material filler system in the electronic packages and methods described herein segregates bonding requirements from thermal conduction requirements so that each function may be achieved by the two material filler system without sacrificing performance. Joint formation may be limited by the filler loading of any thermally conductive inter-chip encapsulant. The electronic packages and methods described herein may extend the use of lower cost and lower thermal conductive fillers by using high filler loading in the non-joint area (i.e., to promote thermal conductivity) and low filler loading in the joint region (i.e., to promote the formation of electrical connections between stacked dies).

High filler loading and larger filler size are conducive to higher thermal conductivity, but may cause filler entrapment and may interfere with chip gap collapse. Therefore, a single encapsulant material is typically unable to balance the need for high thermal conductivity with the properties required for the bonding process. The example electronic packages and methods described herein may de-confound the dual requirements for chip attachment and high thermal conductivity.

In some forms, the electronic packages and methods described herein may extend to peripheral arrays where one material encapsulates the periphery array while another higher thermally conductive material fills the interior of the package. As an example, two different materials may be dispensed before and after the attachment process, including (i) NCPs, CUF, MUF that contain thermally conductive fillers: (ii) at least two die where one of the die includes a thru silicon via (TSV); and (iii) stacked 1 or more layers with localized area of bumps (e.g., less than 30% of the area bumped) which may not or may not be routed based on the overlapping region between the first die (e.g., a logic die) and second die (e.g., memory, graphics etc.).

Therefore, the material coverage area for material 1 of the filler may be as high as 45% for the overlapping region. In addition, material 2 of the filler may be a highly thermally conductive encapsulant that includes thermally conductive fillers to achieve the required thermal dissipation.

Figure 1:
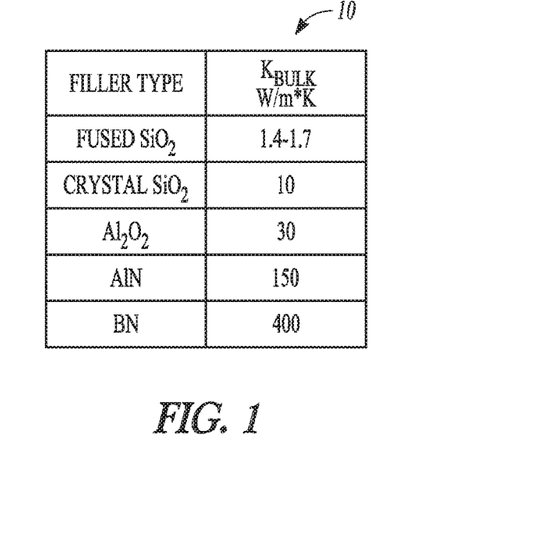
FIG. 1 shows thermal properties of some typical thermal conductive fillers relative to fused silica.

In some forms, the thermally conductive fillers possess thermal conductivity greater than the thermal conductivity of fused silica. FIG. 1 shows thermal properties of some typical thermal conductive fillers 10 relative to fused silica.

Figure 2:
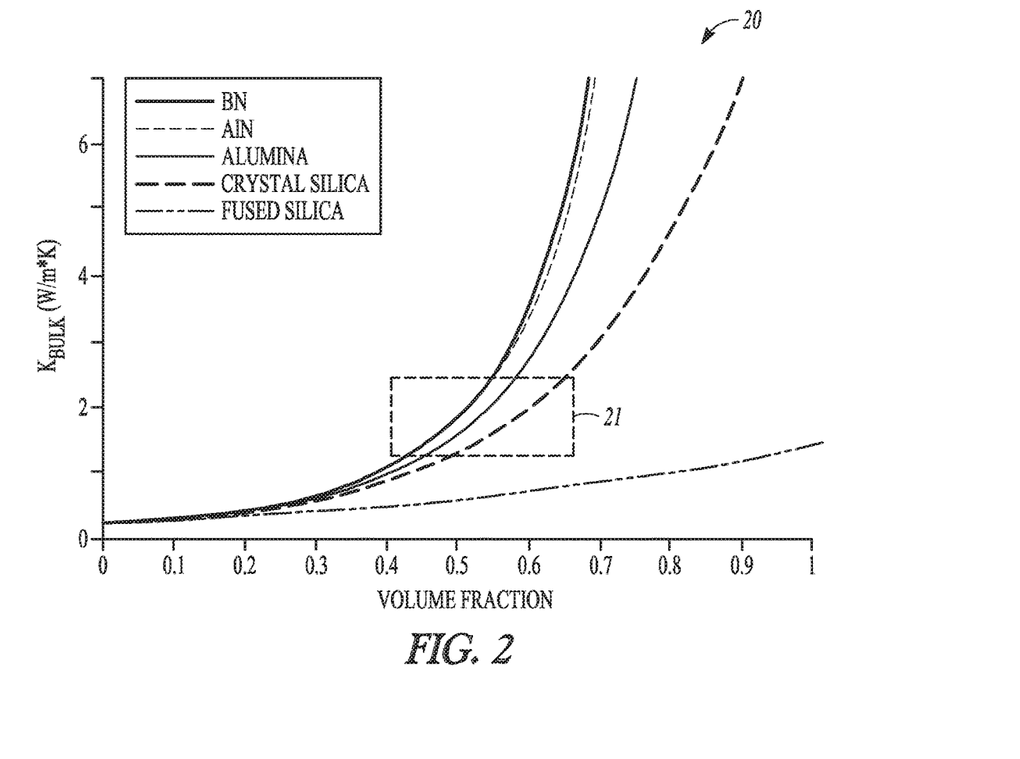
FIG. 2 shows a window that may be suitable to achieve sufficient thermal dissipation for an example stacked electronic package.

It should be noted that the types of thermally conductive fillers that are used for material 1 and material 2 may be tailored to the thermal requirements of the stacked electronic package. FIG. 2 shows a graph 20 of Bruggeman's equation and provides an estimated composite thermal conductivity for respective filler conductivity and resin conductivity for an epoxy resin with a thermal conductivity of 0.23 W/m*K.

The boxed region in FIG. 2 shows a window 21 that would be suitable to achieve 15 W of thermal dissipation for an example stacked electronic package. Since the formulation of material 2 is not bound by the constraints of joint formation, high filler loadings may be used to extend the use of lower cost and lower thermally conductive fillers.

In some forms, an interconnect array may be encapsulated by material 1. The interconnects will dissipate heat, and as such a higher thermally conductive material is not required. It should that material 1 may be defined as any inter-chip material that is different from material 2 as noted by one or more of the following traits: filler type, filler particle size, filler particle size distribution, and filler loadings. In addition, material 1 and material 2 may include similar or dissimilar resin structures so as to facilitate processing of each material.

Figure 3:
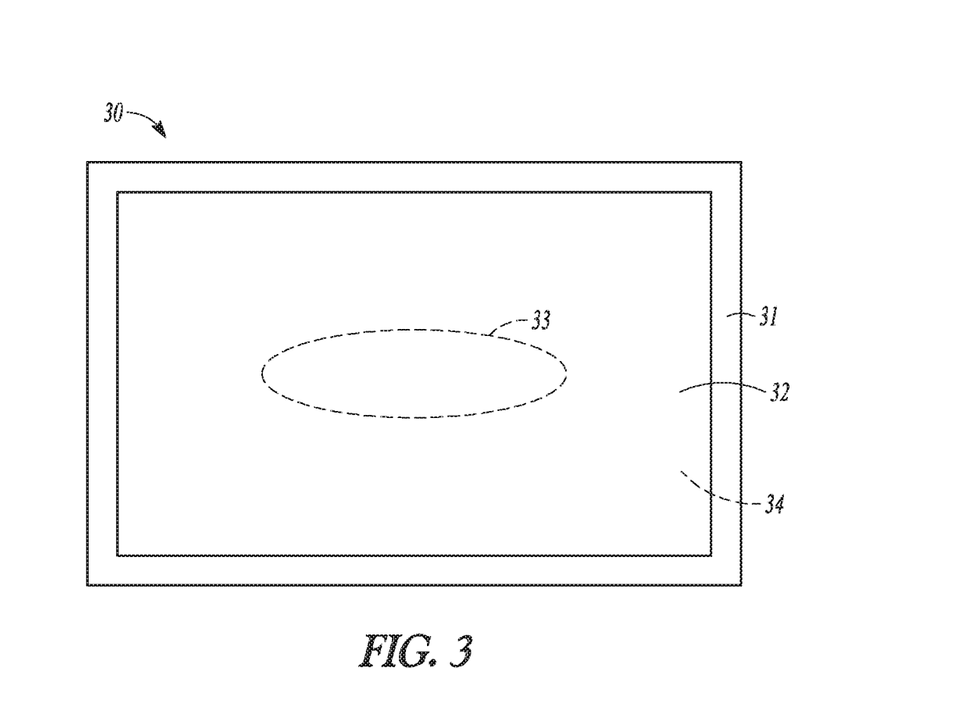
FIG. 3 illustrates a top view of an example electronic package.

FIG. 3 illustrates a top view of an example electronic package 30. The electronic package 30 includes a first die 31 and a second die 32 stacked onto the first die 31.

A first encapsulant 33 is positioned between the first die 31 and the second die 32. The first encapsulant 33 includes a first material that covers a first volume between the first die 31 and the second die 32.

A second encapsulant 34 is positioned between the first die 31 and the second die 32. The second encapsulant 34 includes a second material that covers a second volume between the first die 31 and the second die 32. The first material has a higher thermal conductivity than the second material, and the second material more effectively promotes electrical connections between the first die 31 and the second die 32 as compared to the first material.

In the example form illustrated in FIG. 3, the second encapsulant 34 surrounds the first encapsulant 33. Other forms are contemplated where the second encapsulant 34 does not surround the first encapsulant 33 or only partially surrounds the first encapsulant 33.

Although not illustrated in FIG. 3, the first encapsulant 33 may cover at least one additional volume (only one volume is shown in FIG. 3). The number of additional volumes of the first encapsulant 33 will depend in part on the overall configuration of the electronic package 30 (among other factors). In addition, the second encapsulant 34 may surround (i) each additional volume of the first encapsulant 33; partially surround some (or all) of each additional volume of the first encapsulant 33; and/or not surround some (or all) of each additional volume of the first encapsulant 33.

The types of first filler 33 and second filler 34 that are in the electronic package 30 will depend in part on (i) the application where the electronic package 30 is to be used; (ii) the overall structure of the electronic package 30; and/or (iii) the relative amounts of the first filler 33 and the second filler 34 that are used in the electronic package 30. In some forms, the first material that forms the first filler 33 is more densely packed than the second material that forms the second filler 34.

The first material that forms the first filler 33 and the second material that forms the second filler 34 may include the same resin. Other forms are contemplated where the first material and the second material include different resins or at least one (or both) of the first material and the second material include multiple resins. The type of resins that are included in the first material and the second material will depend in part on (i) the application where the electronic package 30 is to be used; the overall structure of the electronic package 30; (iii) the relative amounts of the first filler 33 and the second filler 34; and/or (iv) the types of materials that form the first die 31 and the second die 32.

In the example form of the electronic package illustrated in FIG. 3, the first die 31 is a different size than the second die 32. Other forms are contemplated where the first die 31 is the same size than the second die 32.

The types of dies that are included in the electronic package 30 will depend in part on the application where the electronic package 30 is to be used. As examples, the first die 31 and/or the second die 32 may be a chip, logic die, memory die, substrate, integrated circuit, processor control hub and/or embedded devices among other types of electronic devices.

Figure 4:
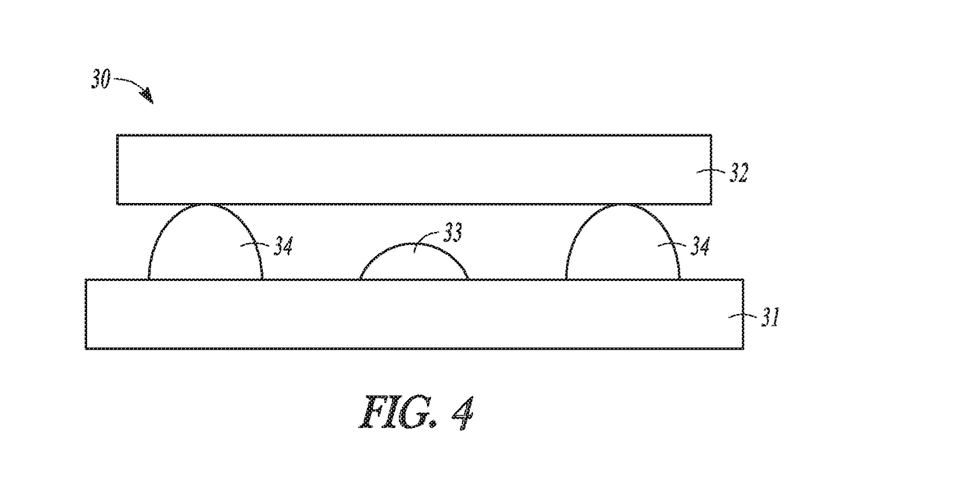
FIG. 4 illustrates a side view of an example electronic package just before the first die and the second die are compressed together.

FIG. 4 illustrates a side view of an example electronic package 30 just before the first die 31 and the second die 32 are compressed together. FIG. 4 shows that the amounts of first encapsulant 33 and second encapsulant 34 that are applied to the first die 31 and/or the second die 32 may differ depending on how the volumes of the first encapsulant 33 and the second encapsulant 34 are to be arranged once the first die 31 and the second die 32 are stacked together. The amounts of the first encapsulant 33 and the second encapsulant 34 that are to be applied to the first die 31 and/or the second die 32 will depend in part on the location and amount of thermal conductivity and electrical connectivity that are required in the respective volumes of the first encapsulant 33 and the second encapsulant 34.

Figure 5:
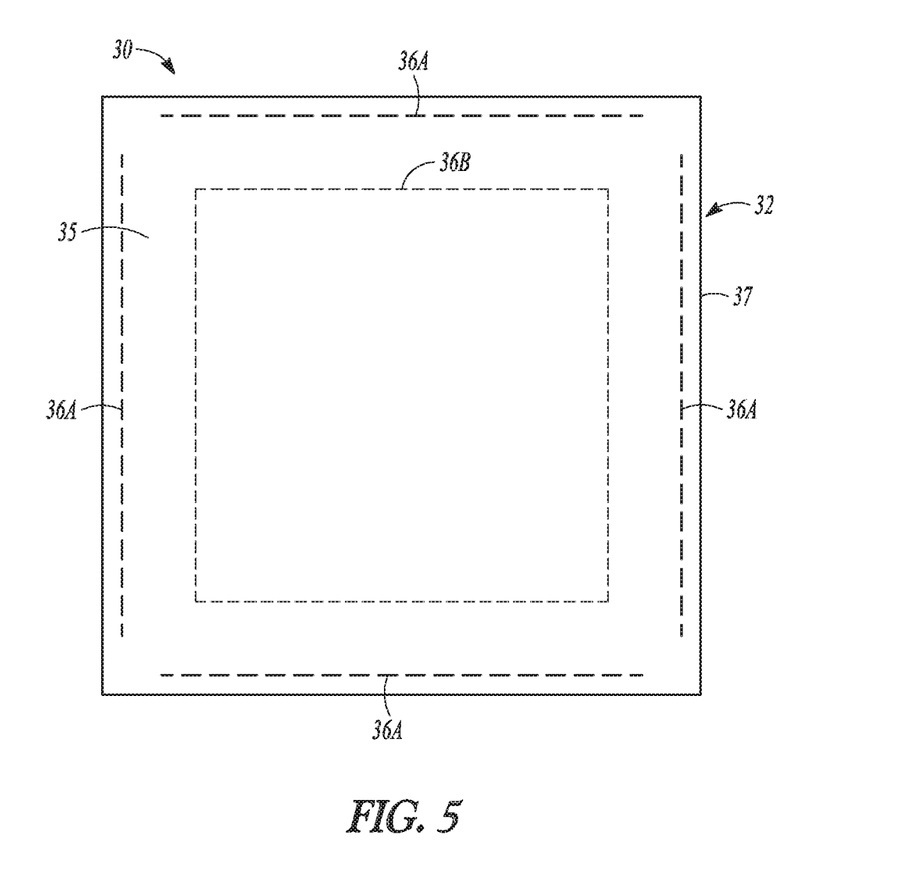
FIG. 5 shows a bottom view of an example electronic package where the first die is removed to expose a lower surface of the second die.

FIG. 5 shows an example bottom view of the example electronic package 30 where the first die 31 is removed to expose a lower surface 35 of the second die 32. The first die 31 and the second die 32 are electrically connected through interconnects 36A, 36B which are visible with the first die 31 removed.

In some forms of the electronic packages and methods described herein, the second encapsulant 34 surrounds the interconnects 36A, 36B. It should be noted that other example forms of the electronic package 30 are contemplated where the second encapsulant 34 surrounds some (or none) of the interconnects 36A, 36B.

In the example forms of the electronic packages 30 and methods described herein, the interconnects 36A, 36B may be arranged in any manner on the first die 31 and/or the second die 32. The manner in which the interconnects 36A, 36B are arranged on the first die 31 and/or the second die 32 will depend in part on (i) the application for the electronic package 30; (ii) the types of chips that are included in the electronic package 30; and/or (iii) the overall configuration of the first die 31 and the second die 32 (among other factors).

As an example, the interconnects 36A may extend around the periphery 37 of one of the first die 31 and the second die 32 (second die 32 is shown in FIG. 5). In other example forms, the interconnects 36A may extend around at least a portion of the periphery 37 of one of the first die 31 and the second die 32.

The interconnects 36B do not extend around the periphery of one of the first die 31 and the second die 32. It should be noted that the electronic package 30 may include different types of interconnects. As an example, the interconnects 36A are larger than the interconnects 36B. In addition, the interconnects 36A or 36B may be arranged in a staggered configuration in order to preserve valuable space on the first die 31 and/or second die 32.

Figure 6:
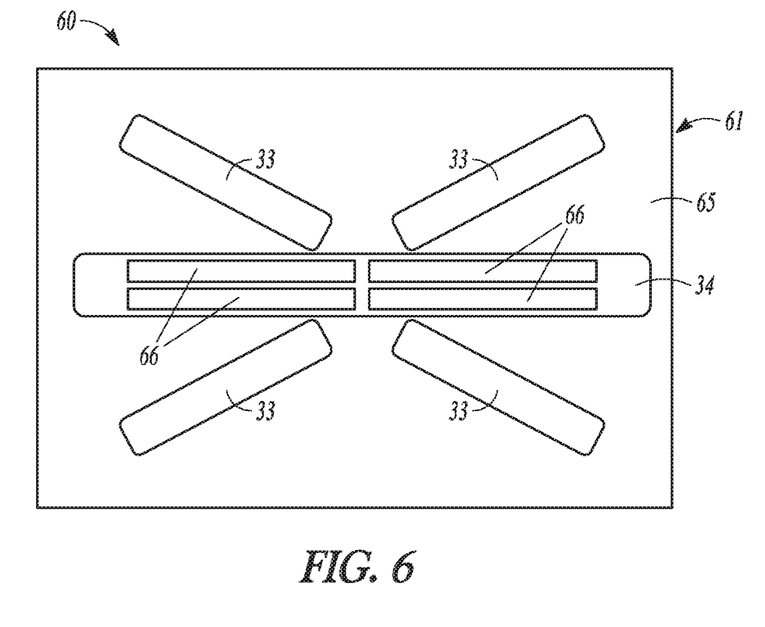
FIG. 6 shows a top view of another example electronic package where the second die is removed to expose an upper surface of the second die.

FIG. 6 shows a top view of another example electronic package 60 where the second die is removed to expose an upper surface 65 of a first die 61. The first die 61 and the second die are electrically connected through interconnects 66 which are visible with the second die removed.

In some forms of the electronic package 60, the second encapsulant 34 surrounds the interconnects 66 (four interconnects 66 are shown in FIG. 6). It should be noted that other example forms of the electronic package 60 are contemplated where the second encapsulant 34 surrounds some (or none) of the interconnects 66. In the example electronic package 60 shown in FIG. 6, four areas of first encapsulant 33 are on either side of the second encapsulant 34.

Figure 7:
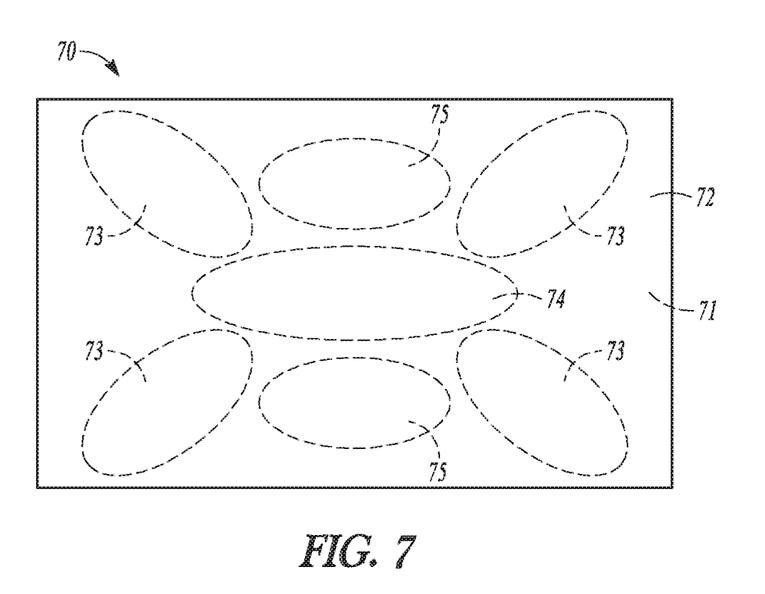
FIG. 7 illustrates a top view of another example electronic package.

FIG. 7 illustrates a top view of another example electronic package 70. The electronic package 70 includes a first die 71 and a second die 72 stacked onto the first die 71. In the example form illustrated in FIG. 7, the first die 71 is the same size as the second die 72, although the first die 71 and the second die 72 may be different sizes.

A first encapsulant 73 is positioned between the first die 71 and the second die 72. The first encapsulant 73 includes a first material that covers a plurality of first volumes between the first die 71 and the second die 72.

A second encapsulant 74 is positioned between the first die 71 and the second die 72. The second encapsulant 74 includes a second material that covers a second volume between the first die 71 and the second die 72. The first material has a higher thermal conductivity than the second material, and the second material more effectively promotes electrical connections between the first die 71 and the second die 72 as compared to the first material.

Although not illustrated in FIG. 7, the second encapsulant 74 may cover at least one additional volume (only one volume is shown in FIG. 7). The number of volumes of the first encapsulant 73 will depend in part on the overall configuration of the electronic package 70 (among other factors).

As shown in FIG. 7, the electronic package may further include a third encapsulant 75 that is positioned between the first die 71 and the second die 72. The third encapsulant 75 may include a third material that covers at least one third volume between the first die 71 and the second die 72 (two volumes of third encapsulant 75 are shown in FIG. 7). The third material may have a different thermal conductivity than the first material and the second material and/or the third material may promote electrical connections between the first and second die differently than the first material and the second material.

The first material that forms the first filler 73, the second material that forms the second filler 74 and the third material that forms the third filler 75 may all include the same resin. Other forms are contemplated where the first material, the second material and the third material include different resins or at least one (some or all) of the first, second and third materials include multiple resins.

Figure 8:
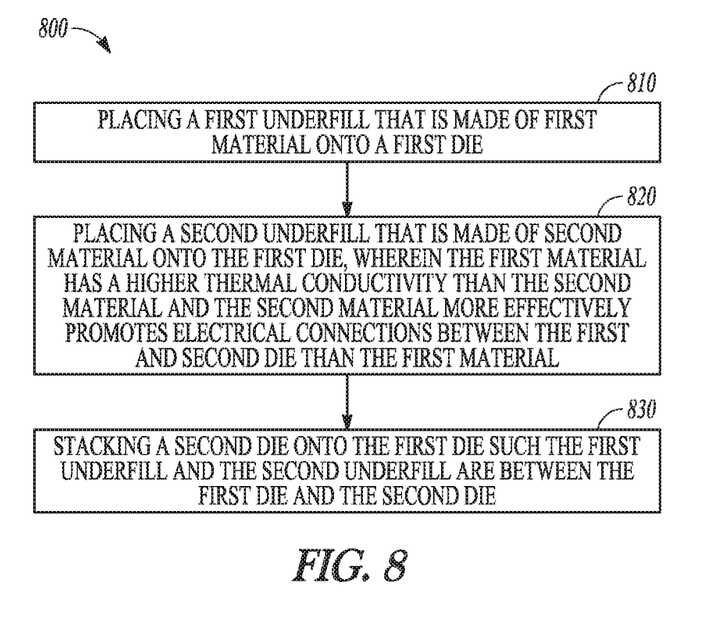
FIG. 8 is a flow diagram illustrating an example method of fabricating an example electronic package.

FIG. 8 is a flow diagram illustrating an example method [800] of fabricating an electronic package 30 (see FIG. 3). The method [800] includes [810] placing a first encapsulant 33 that is made of first material onto a first die 31 and [820] placing a second encapsulant 34 that is made of second material onto the first die 31. In some forms, [820] placing a second encapsulant 34 onto the first die 31 includes surrounding (sometimes just partially) the first encapsulant 33 with the second encapsulant 34.

The first material has a higher thermal conductivity than the second material. In addition, the second material more effectively promotes electrical connections between the first die 31 and the second die 32 than the first material.

The method [800] further includes [830] stacking a second die 32 onto the first die 31 such the first encapsulant 33 and the second encapsulant 34 are between the first die 31 and the second die 32. The second die 32 may be stacked onto the first die 31 using any technique that is known now or discovered in the future.

In some forms of the method [800], [820] placing a second encapsulant 34 onto the first die 31 includes surrounding interconnects 36A, 36B that electrically connect the first die 31 to the second die 32 with the second encapsulant 34. The manner in which the interconnects 36A, 36B are surrounded by the second encapsulant 34 will depend in part on cost, manufacturing considerations and the functionality associated with fabricating the electronic package 30 (among other factors).

In addition, [820] placing a second encapsulant 34 onto the first die 31 may include placing the second encapsulant 34 around at least a portion of a periphery 37 of one the first die 31 and the second die 32

Figure 9:
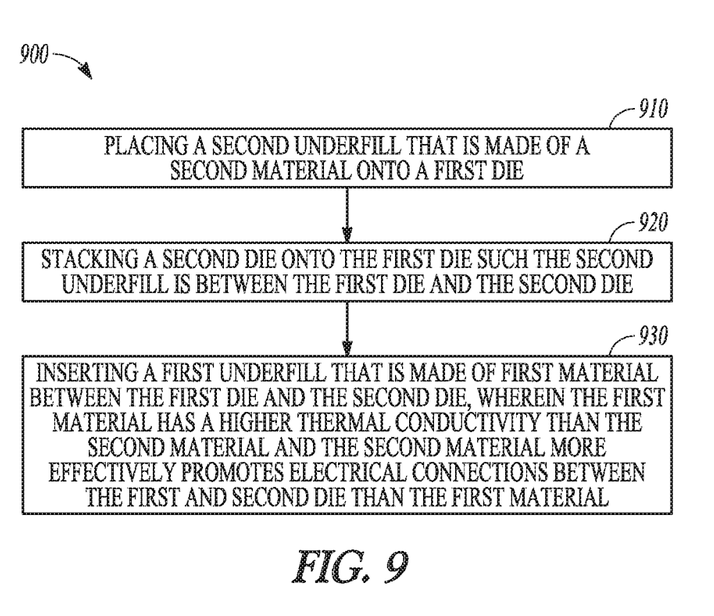
FIG. 9 is a flow diagram illustrating another example method of fabricating an example electronic package.

FIG. 9 is a flow diagram illustrating another example method [900] of fabricating an electronic package 30. The method [900] includes [910] placing a second encapsulant 34 that is made of a second material onto a first die 31 and [920] stacking a second die 32 onto the first die 31 such that the second encapsulant 34 is between the first die 31 and the second die 32. The second die 32 may be stacked onto the first die 31 using any technique that is known now or discovered in the future.

The method [900] further includes [930] inserting a first underfill 33 that is made of first material between the first die and the second die. The first material has a higher thermal conductivity than the second material and the second material more effectively promotes electrical connections between the first die 31 and second die 32 than the first material.

In some forms of the method [900], [930] inserting a first underfill between the first die 31 and the second die 32 may include (i) surrounding (sometimes only partially) the second underfill 34 with the first underfill 33; (ii) surrounding interconnects 36A, 36B that electrically connect the first die 31 to the second die 32 with the first underfill 33; and/or (iii) placing the first underfill 34 around at least a portion of a periphery 37 of one the first die 31 and the second die 32.

The manner in which the first underfill 33 surrounds the second underfill 34 and in which the interconnects 36A, 36B are surrounded by the second underfill 34 will depend in part on cost, manufacturing considerations and the functionality associated with fabricating the electronic package 30 (among other factors). The type, size and configuration of the first die 31 and the second die 32 that are included in the methods [800], [900] will depend in part on the overall desired configuration and function of the electronic package 30.

The electronic packages and methods described herein may enable the use of a lower thermally conductive filler in combination with a higher thermally conductive material. The use of two different fillers may address the needs related to attachment processes for stacking dies as well the thermal management requirements of the electronic packages described herein.

To better illustrate the method and electronic packages disclosed herein, a non-limiting list of embodiments is provided here.

Example 1 includes an electronic package. The electronic package a substrate; a die attached to the substrate; and an encapsulant positioned between the die and the substrate due to capillary action; and a support surrounding the die.

Example 2 includes the electronic package of example 1, wherein the die is flip chip bonded to the substrate.

Example 3 includes the electronic package of any one of examples 1-2, wherein the encapsulant secures the support to the substrate.

Example 4 includes the electronic package of any one of examples 1-3, wherein the encapsulant secures the support to the die.

Example 5 includes the electronic package of any one of examples 1-4, wherein the support has a substantially uniform cross-section.

Example 6 includes the electronic package of any one of examples 1-5, wherein the support has an inner bottom edge and an outer bottom edge, the inner bottom edge being chamfered to receive encapsulant when the support is mounted around the die.

Example 7 includes the electronic package of example 6, wherein the support has an inner upper edge and an inner outer upper edge, the inner upper edge including a channel to receive excess encapsulant that flows upward between the die and the support when the support is mounted around the die.

Example 8 includes the electronic package of any one of examples 1-7, wherein the cross-section of the support changes such that the cross-section is larger in areas of relatively higher stress on the die and smaller in areas of relatively lower stress on the die.

Example 9 includes the electronic package of example 8, wherein the support has an inner lower edge and an outer lower edge, the support including a passage and an outer surface, the passage extending from the inner lower edge of the support to the outer surface of the support such that the encapsulant flows from the outer surface through the passage to the inner lower edge when the support is mounted around the die.

Example 10 includes the electronic package of example 9, wherein the passage extends from the outer surface of the support on one side of the support.

Example 11 includes a method that includes attaching a die to a substrate; inserting an encapsulant between the die and the substrate using capillary action; and placing a support around the die such that the support surrounds the die.

Example 12 includes the method of any one of example 11, wherein attaching the die to the substrate includes attaching the die to the substrate using flip chip bonding.

Example 13 includes the method of any one of examples 11-12, wherein placing a support around the die such that the support surrounds the die includes attaching the support to the die using the encapsulant.

Example 14 includes the method of any one of examples 11-13, wherein placing a support around the die such that the support surrounds the die includes attaching the support to the substrate using the encapsulant.

Example 15 includes the method of any one of examples 11-14, and further including curing the encapsulant.

Example 16 includes the method of any one of examples 11-15, and further including removing encapsulant through open areas in the support.

Example 17 includes the method of any one of examples 11-16, wherein inserting an underfill between the die and the substrate using capillary action includes inserting the underfill through a passage in the support from an outer surface of the support to a lower inner edge of the support.

Example 18 includes an electronic package. The electronic package includes a die; a support molded to the die, wherein the support surrounds the die; a substrate; and an underfill that attaches the die and the support to the substrate due to capillary action of the underfill between the support and the die and the substrate.

Example 19 includes the electronic package of example 18, wherein the die is flip chip bonded to the substrate.

Example 20 includes the electronic package of any one of examples 18-19, wherein the substrate includes a plurality of redistribution layers and the underfill attaches the die and the support to at least one of the redistribution layers that form the substrate.

These and other examples and features of the present electronic device, solder compositions, and related methods will be set forth in part in the detailed description. This overview is intended to provide non-limiting examples of the present subject matter—it is not intended to provide an exclusive or exhaustive explanation. The detailed description is included to provide further information about the systems, and methods.

Figure 10:
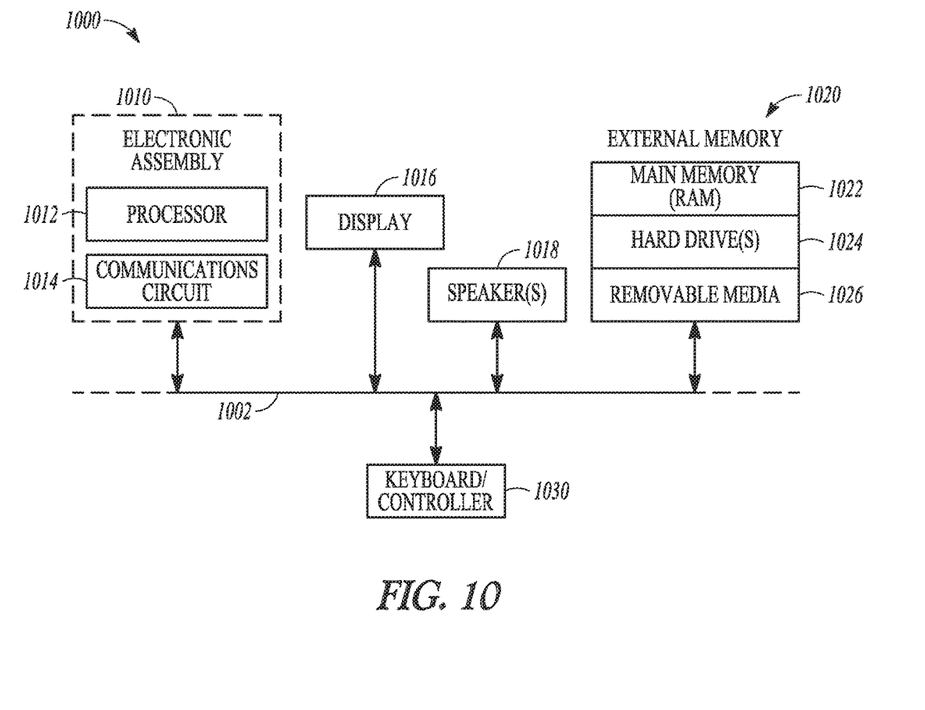
FIG. 10 is a block diagram of an electronic device incorporating at least one electronic package and/or method described herein.

An example of an electronic device using the electronic packages methods that are described in the present disclosure is included to show an example of a higher level device application for the present invention. FIG. 10 is a block diagram of an electronic device 1000 incorporating at least one electronic package and/or method described herein. Electronic device 1000 is merely one example of an electronic system in which embodiments of the present invention may be used.

Examples of electronic devices 1000 include, but are not limited to personal computers, tablet computers, mobile telephones, game devices, MP3 or other digital music players, etc. In this example, electronic device 1000 comprises a data processing system that includes a system bus 1002 to couple the various components of the system. System bus 1002 provides communications links among the various components of the electronic device 800 and can be implemented as a single bus, as a combination of busses, or in any other suitable manner.

An electronic package 1010 is coupled to system bus 1002. The electronic package 1010 can include any circuit or combination of circuits. In one embodiment, the electronic package 1010 includes a processor 1012 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic package 1010 are a custom circuit, an application-specific integrated circuit (ASIC), or the like, such as, for example, one or more circuits (such as a communications circuit 1014) for use in wireless devices like mobile telephones, tablet computers, laptop computers, two-way radios, and similar electronic systems. The IC can perform any other type of function.

The electronic device 1000 can also include an external memory 820, which in turn can include one or more memory elements suitable to the particular application, such as a main memory 1022 in the form of random access memory (RAM), one or more hard drives 1024, and/or one or more drives that handle removable media 1026 such as compact disks (CD), flash memory cards, digital video disk (DVD), and the like.

The electronic device 1000 can also include a display device 1016, one or more speakers 1018, and a keyboard and/or controller 1030, which can include a mouse, trackball, touch screen, voice-recognition device, or any other device that permits a system user to input information into and receive information from the electronic device 1000.

This overview is intended to provide non-limiting examples of the present subject matter—it is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of"at least one" or "hone or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic package comprising:
 a first die;
 a second die stacked onto the first die; and
 a first encapsulant positioned between the first die and the second die, the first encapsulant including a first material, the first encapsulant occupying a plurality of separate and non-contiguous volumes between the first die and the second die;
 a second encapsulant positioned between the first die and the second die, the second encapsulant including a second material that surrounds each of the plurality of separate and non-contiguous volumes between the first die and the second die, wherein the first material has a higher thermal conductivity than the second material, and the second material provides greater adhesion between the first and second dies than the first material; and
 a third encapsulant positioned between the first die and the second die, the third encapsulant including a third material, the third encapsulant occupies a separate and non-contiguous volume between the first die and the second die, wherein the third material has a different thermal conductivity than the first material and the second material.

2. The electronic package of claim 1, wherein the first die and the second die are electrically connected through interconnects.

3. The electronic package of claim 2, wherein the second encapsulant surrounds the interconnects.

4. The electronic package of claim 2, wherein the interconnects extend around at least a portion of a periphery of one of the first die and the second die.

5. The electronic package of claim 1, wherein a first filler in the first material is more densely packed than a second filler in the second material.

6. The electronic package of claim 5, wherein the first material and the second material include the same resin.

7. The electronic package of claim 1, wherein the first die is a different size than the second die.

8. The electronic package of claim 1, wherein the third material includes the same resin as at least one of the first material and the second material.

9. A method comprising:
   placing a first encapsulant that is made of a first material onto a first die such that the first material occupies a plurality of separate and non-contiguous volumes between the first die and the second die;
   placing a second encapsulant that is made of a second material onto the first die such that the third material occupies a separate and non-contiguous volume between the first die and the second die;
   placing a third encapsulant that is made of a third material onto the first die such that the third encapsulant surrounds each of the plurality of separate and non-contiguous volumes of the first encapsulant between the first die and the second die and surrounds separate and non-contiguous volume of the third encapsulant between the first die and the second die, wherein the first material has a higher thermal conductivity than the third material and the third material provides greater adhesion between the first and second dies than the first material, wherein the third material has a different thermal conductivity than the first encapsulant and the second encapsulant; and
   stacking a second die onto the first die such the first encapsulant and the second encapsulant are between the first die and the second die.

10. The method of claim 9, wherein placing a second encapsulant onto the first die includes surrounding interconnects that electrically connect the first die to the second die with the second encapsulant.

11. The method of claim 9, wherein placing a second encapsulant onto the first die includes placing the second encapsulant around at least a portion of a periphery of one the first die and the second die.

* * * * *

UNITED STATES PATENT AND TRADEMARK OFFICE
CERTIFICATE OF CORRECTION

PATENT NO. : 10,475,715 B2
APPLICATION NO. : 15/037851
DATED : November 12, 2019
INVENTOR(S) : McMahan et al.

Page 1 of 1

It is certified that error appears in the above-identified patent and that said Letters Patent is hereby corrected as shown below:

On the Title Page

Item (56), on page 2, in Column 2, under "Other Publications", Line 6, delete "2016"," and insert --2018,"-- therefor Signed and Sealed this
Twenty-eighth Day of December, 2021

Drew Hirshfeld
*Performing the Functions and Duties of the
Under Secretary of Commerce for Intellectual Property and
Director of the United States Patent and Trademark Office*